United States Patent
Cok et al.

(10) Patent No.: US 6,909,233 B2
(45) Date of Patent: Jun. 21, 2005

(54) STACKED OLED DISPLAY HAVING IMPROVED EFFICIENCY

(75) Inventors: Ronald S. Cok, Rochester, NY (US); Michael E. Miller, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 57 days.

(21) Appl. No.: 10/459,293

(22) Filed: Jun. 11, 2003

(65) Prior Publication Data

US 2004/0251820 A1 Dec. 16, 2004

(51) Int. Cl.⁷ .................................................. H01J 1/62
(52) U.S. Cl. ..................................... 313/506; 313/504
(58) Field of Search ................................ 313/498, 501, 313/503, 504, 506

(56) References Cited

U.S. PATENT DOCUMENTS

| | | |
|---|---|---|
| 5,703,436 A | 12/1997 | Forrest et al. |
| 6,274,980 B1 | 8/2001 | Burrows et al. |
| 6,366,025 B1 | 4/2002 | Yamada |
| 2002/0024618 A1 | 2/2002 | Imai |
| 2002/0153243 A1 | 10/2002 | Forrest et al. |
| 2002/0186214 A1 | 12/2002 | Siwinski |
| 2003/0089252 A1 | 5/2003 | Sarnecki |

FOREIGN PATENT DOCUMENTS

| | | |
|---|---|---|
| EP | 1 032 045 | 8/2000 |
| EP | 1 450 341 | 8/2004 |
| JP | 2000/200061 | 7/2000 |
| JP | 2003/036973 | 2/2003 |
| WO | 99/03157 | 1/1999 |
| WO | 00/11728 | 3/2000 |
| WO | 03/027998 | 4/2003 |

OTHER PUBLICATIONS

U.S. Appl. No. 10/426,999, filed Apr. 30, 2003, by Cok et al.
U.S. Appl. No. 10/412,534, filed Apr. 11, 2003, by Arnold et al.
U.S. Appl. No. 10/320,195, filed Dec. 16, 2002, by Miller et al.

Primary Examiner—Vip Patel
(74) Attorney, Agent, or Firm—Andrew J. Anderson

(57) ABSTRACT

An OLED device includes a pixel having a plurality of individually addressable light emitting elements including a light emitting element for emitting white light, and one or more light emitting elements for emitting colored light; at least one of the light emitting elements being stacked on top of another of the light emitting elements; and the white light emitting element(s) being more efficient than at least one of the colored light emitting element(s).

35 Claims, 8 Drawing Sheets

STACKED OLED DISPLAY HAVING IMPROVED EFFICIENCY

FIELD OF THE INVENTION

The present invention relates to OLED color displays and, more particularly, to arrangements of light emitting elements in the pixels of such OLED color displays.

BACKGROUND OF THE INVENTION

OLEDs have been proposed for use in flat panel display devices, however the light emissive materials in an OLED age over time with use. The aging rate is directly related to the cumulative current density passed through the light emitting materials. This is a problem because as the resolution of a display device increases for a given display size, the pixel sizes decrease, thereby increasing the rate of aging for a given brightness.

One approach to dealing with the aging problem, while maintaining the resolution of the display, is to stack the OLED light emitting elements on top of each other thereby allowing the areas of the light emitting elements to be larger. This approach is described in U.S. Pat. No. 5,703,436 issued Dec. 30, 1997 to Forrest et al., and U.S. Pat. No. 6,274,980 issued Aug. 14, 2001 to Burrows et al. Stacked OLEDs utilize a stack of pixel elements located one above another over a substrate. Each pixel element is individually controlled using conventional controllers. Power is supplied to the pixel elements from the controller through transparent electrodes which may be shared between pixel elements adjacent to each other in the stack.

It is also known that different OLED materials for emitting different colors of light age at different rates as they are used. It is also known to provide an OLED display having pixels with differently sized red, green and blue light emitting elements, wherein the relative sizes of the elements in a pixel are selected according to their relative aging characteristics to extend the service life of the display. See U.S. Pat. No. 6,366,025 B1, issued Apr. 2, 2002 to Yamada.

While power efficiency in a display device is always desirable, it is particularly desirable in portable applications because an inefficient display limits the time the device can be used before the power source is recharged. In fact, for certain applications the rate of power consumption may be more important than any other display characteristic including aging and resolution.

There is a need, therefore, for an improved full color flat panel OLED display having improved power efficiency.

SUMMARY OF THE INVENTION

The need is met according to the present invention by providing an OLED device that includes a pixel having a plurality of individually addressable light emitting elements including a light emitting element for emitting white light, and one or more light emitting elements for emitting colored light; at least one of the light emitting elements being stacked on top of another of the light emitting elements; and the white light emitting element(s) being more efficient than at least one of the colored light emitting element(s).

BRIEF DESCRIPTION OF THE DRAWINGS

FIG. 11c is a schematic top view of an alternative embodiment of a stacked OLED pixel of the type shown in FIG. 11a;

DETAILED DESCRIPTION OF THE INVENTION

Figure 2:
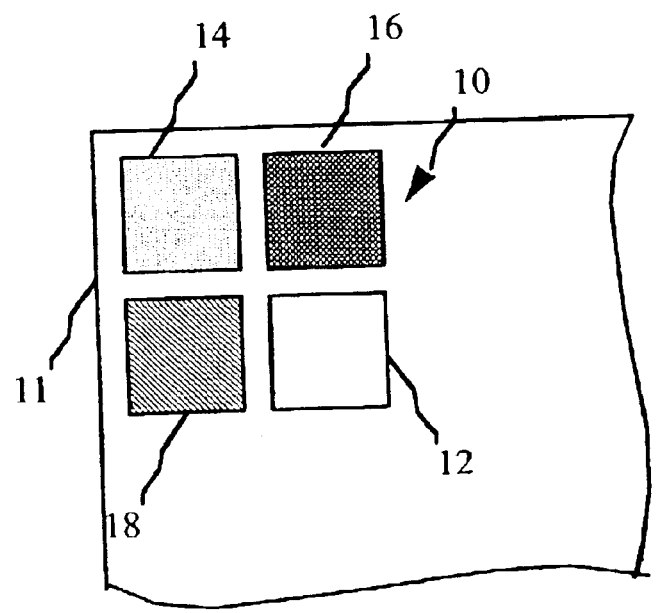
FIG. 2 is a schematic top view of an OLED pixel having a power saving arrangement of plurality of non-stacked individually addressable light emitting elements including a light emitting element for emitting white light, and one or more light emitting elements for emitting colored light.

Commonly assigned U.S. Patent Application Publication 2002/0186214A1, by Siwinski, published Dec. 12, 2002; U.S. Ser. No. 10/426,999, filed Apr. 30, 2003 by Cok et al.; U.S. Ser. No. 10/412,534 filed Apr. 11, 2003 by Arnold et al.; and U.S. Ser. No. 10/320,195 filed Dec. 16, 2002 by Miller et al. (which are incorporated herein by reference), show methods for saving power in an organic light emitting diode (OLED) display having pixels comprised of red, green, blue and white light emitting elements. The white light emitting elements are more efficient than the other colored light emitting elements and are employed to reduce the power requirements of the display. Referring to FIG. 2, an arrangement of four pixels 10 having red 14, green 16, blue 18 and white 12 light emitting elements are formed on a substrate 11 as taught by US 2002/0186214A1, referenced above, is shown. The light emitting elements in each pixel 10 are arranged in a two by two array. Applicants' studies have shown that the use of the white light emitting element to produce unsaturated colors in a display having pixels of the type shown in FIG. 2 can substantially increase the lifetime of the display and decrease the power usage of the display.

An OLED device according to the present invention includes a pixel having a plurality of individually addressable light emitting elements; including at least one light emitting element for emitting white light, and one or more light emitting elements for emitting colored light. The white light emitting element(s) is more efficient than at least one of the colored light emitting elements and at least one of the light emitting elements is stacked on top of another of the light emitting elements to reduce the size of the pixels in the display for a given area of light emitting material, thereby providing a more power efficient display while increasing the resolution of the display.

For clarification, as used herein, the term "white light emitting element" is used to define any light emitting element that when measured for color and plotted in CIE xy chromaticity coordinate space along with the colors of the other light emitting elements, the color of the light emitting element is inside a gamut boundary defined by the other light emitting elements. The OLED material of the white light emitting element is selected to have a luminous power efficiency that is higher than at least one of the other light emitting elements. Such white light emitting materials can be selected from those known in the art.

Figure 1A:
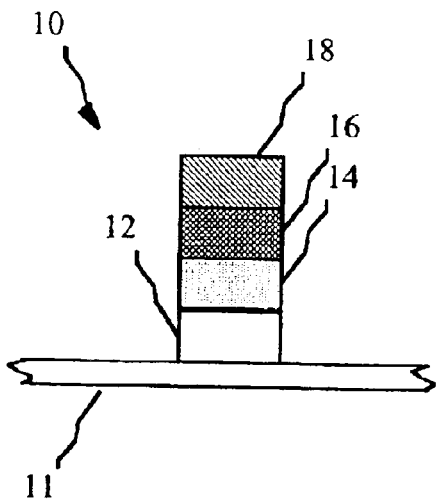
FIGS. 1a and b are schematic side and top views of a stacked OLED pixel according to one embodiment of the present invention.
Figure 1B:

Referring to FIGS. 1a and b, an OLED device includes a pixel 10, having an individually addressable white light emitting element 12 and a plurality of colored light emitting elements including red 14, green 16, and blue 18 light emitting elements stacked, one on top of another, on substrate 11. The white light emitting element 12 is more efficient than one or more of the red 14, green 16, or blue 18 light emitting elements. In the top view shown in FIG. 1b, the stacks are labeled with letters indicating the colors of light emitted by the stack. This convention will also be employed in the figures to follow. Transparent electrodes (not shown) provide power to the individually addressable light emitting elements 12, 14, 16, and 18 as is taught in the prior art, for example in U.S. Pat. No. 5,703,436, referenced above.

The arrangement of stacked light emitting elements shown in FIGS. 1a and b is the most compact arrangement but also has the most stringent process and materials requirements. For example, the light emitted by the white light emitting element 12 must pass through four layers of electrode material and the number of material deposition steps is relatively high, since four light emitting elements are stacked one on top of the other.

Figure 3A:
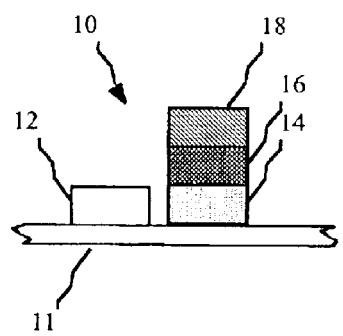
FIGS. 3a and b are schematic side and top views of a stacked OLED pixel according to an alternative embodiment of the present invention.
Figure 3B:
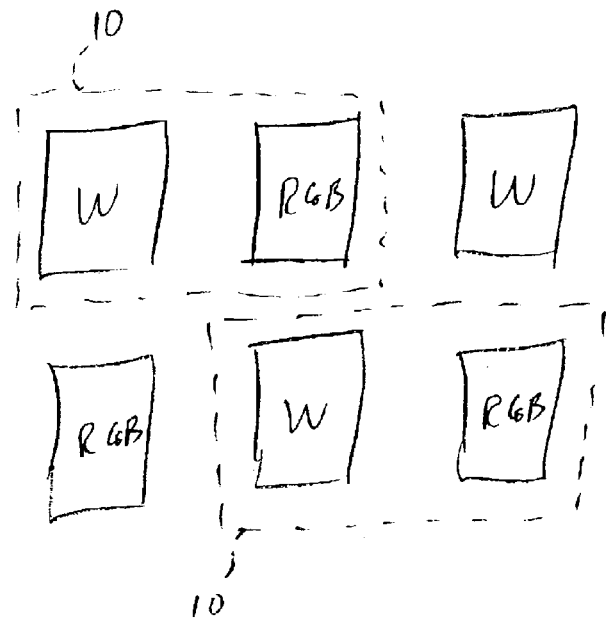

Referring to FIGS. 3a and b, the red 14, green 16, and blue 18 light emitting elements are arranged in a stack, and the white light emitting element 12 is located adjacent the stack. This arrangement provides a simpler structure that optimizes the light emission of the more efficient white light emitting element 12. As shown in FIG. 3b, the pixels may be staggered from row to row to provide a more uniform distribution of white light emitting elements in a display. Alternatively, the pixels may be aligned (not shown) to provide a striped pattern of light emitting elements. Also, under some circumstances, it may be desirable to locate the least light efficient or least stable element adjacent the stack of other light emitting elements.

Figure 4A:
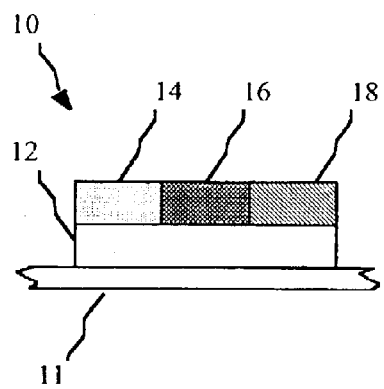
FIGS. 4a and b are schematic side and top views of a stacked OLED pixel according to an alternative embodiment of the present invention.
Figure 4B:
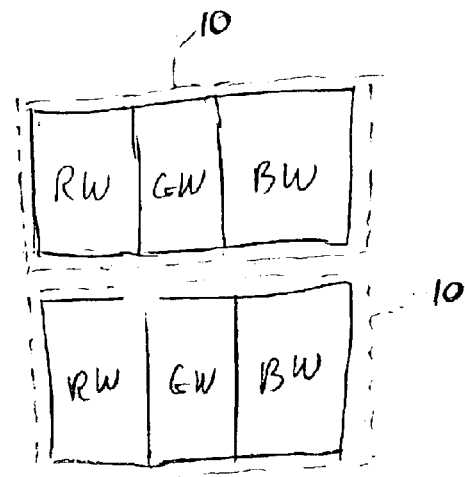

The present invention can also be arranged to provide multiple layers of independently addressable light emitting elements having different resolutions, i.e. different numbers of light emitting elements per unit area. For example, white light emitting elements having lower resolution and hence a larger light emitting area than the light emitting areas of the colored light emitting elements may be provided, thereby improving the lifetime of the white light emitting elements. Referring to FIGS. 4a and b, the light emitting area of a larger white light emitting element 12 is the same as the combined light emitting areas of the red 14, green 16, and blue 18 light emitting elements. The red 14, green 16, and blue 18 light emitting elements may be located above the white light emitting element 12 as shown or alternatively below the white light emitting element 12 (not shown). This arrangement has the advantage of improved lifetime compared to conventional, non-stacked arrangements such as those of Siwinski (noted above) and a simpler structure than the stacked arrangements wherein more than two light emitting elements are stacked one on the other as shown in FIG. 1.

Figure 5A:
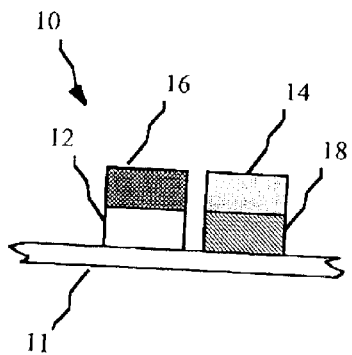
FIGS. 5a, b and c are schematic side and top views of a stacked OLED pixel according to an alternative embodiment of the present invention.
Figure 5B:
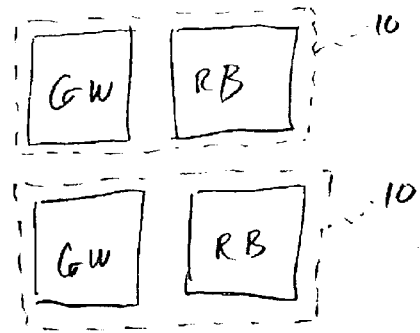

It is also possible to provide a pixel having multiple stacks of light emitting elements wherein the white light emitting element 12 is the same size as the other light emitting elements. Referring to FIGS. 5a and b, the white light emitting element 12 is stacked with the green light emitting element 16; and the light emitting blue 18 and red light emitting 14 are arranged in a separate stack.

It is known that the human eye is most sensitive to green light and less sensitive to red and blue light. More specifically, the spatial resolution of the human visual system is driven primarily by the luminance rather than the chrominance information in an image. Since green light provides the preponderance of luminance information in typical viewing environments, the spatial resolution of the visual system during normal daylight viewing conditions is highest for green light, lower for red light, and even lower for blue light when viewing images generated by a typical color balanced image capture and display system. This fact has been used in a variety of ways to optimize the frequency response of imaging systems. For example, as described in U.S. Patent Application Publication 2002/0024618 A1, by Imai, published Feb. 28, 2002, in a pixel having a square array of red, green, blue and white light emitting elements, the green and white light emitting elements having large luminance components are positioned diagonally opposite in the array.

Figure 5C:
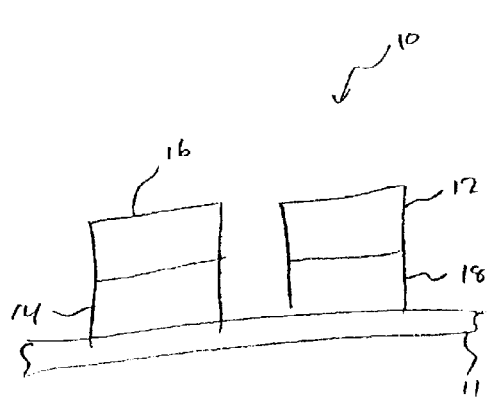

Stacked pixel structures having a plurality of spatially separated luminance elements (i.e. green and/or white light emitting elements) in a pixel can provide a display device with higher spatial resolution. This principle can be employed to advantage as shown in FIG. 5c by including the green light emitting element in one stack, with the white light emitting element in the other.

Figure 6A:
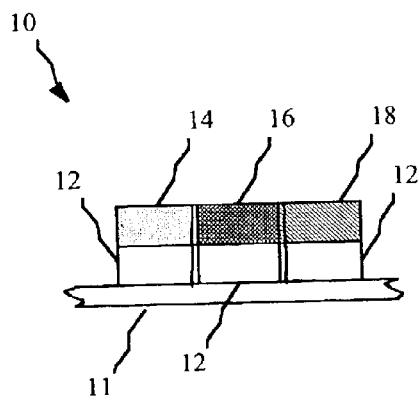
FIGS. 6a, b and c are schematic side and top views of a stacked OLED pixel according to an alternative embodiment of the present invention.
Figure 6B:
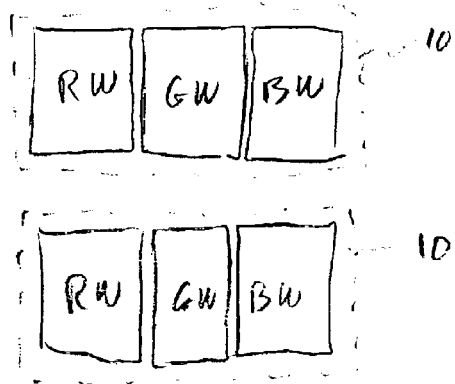
Figure 7:
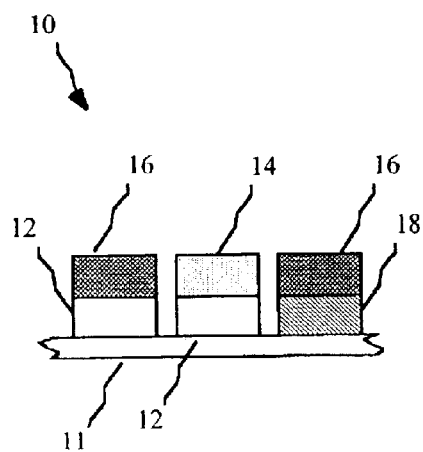
FIG. 7 is a schematic side view of a stacked OLED pixel according to an alternative embodiment of the present invention.
Figure 8:
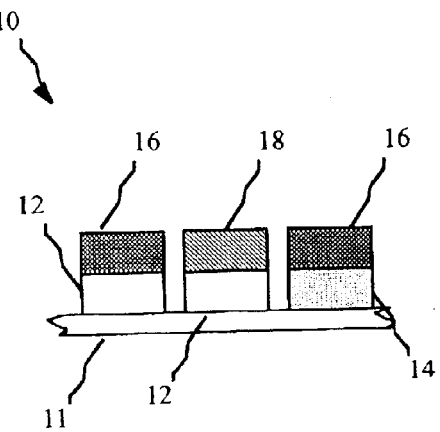
FIG. 8 is a schematic side view of a stacked OLED pixel according to an alternative embodiment of the present invention.

Referring to FIGS. 6a and b, an alternative pixel arrangement 10 having stacked light emitting elements includes a plurality of individually addressable white light emitting elements 12 in a plurality of stacks. As shown in FIGS. 6a and b, one independently addressable white light emitting element 12 is stacked with each of the red light emitting element 14, the green light emitting element 16, and the blue light emitting element 18. A variety of such arrangements are possible. Since additional spatially separated green light emitting elements can also improve the spatial resolution of a display, a plurality of independently addressable green light emitting elements can also be employed in a pixel. For example, FIGS. 7 and 8 show pixels having two green and two white light emitting elements and one red and one blue light emitting elements, respectively.

Figure 6C:
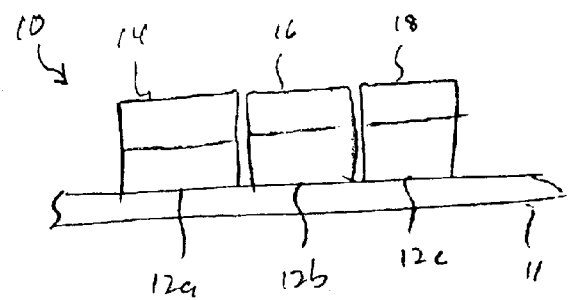

It may be desirable to provide high efficiency white light emitting elements composed of different materials to provide a plurality of white light emitting elements having different white points. For example, as shown in FIG. 6c, white light emitting element 12a might have a white point that is biased towards red; white light emitting element 12b might have a white point that is biased toward green; and white light emitting element 12c might have a white point that is biased toward blue. Using these three different white points, the white light emitting elements provide a smaller color gamut within the larger gamut of the display and for this reason, these higher efficiency elements can be used to produce desaturated colors more efficiently. As shown FIG. 6c, the respective white light emitting elements are spatially associated with the corresponding colored light emitting elements. Alternatively, to provide higher resolution, the white light emitting elements having different white points may be associated with a differently colored light emitting element (not shown).

Figure 16A:
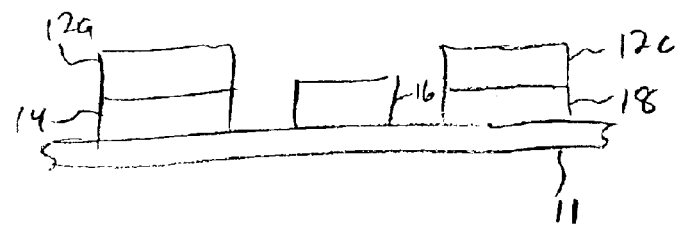
FIGS. 16a and b are schematic side and top views of a stacked OLED pixel according to an alternative embodiment of the present invention.
Figure 16B:
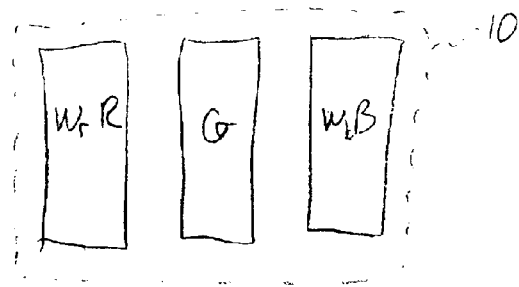

In an alternative arrangement, five light emitting elements are employed. Referring to FIGS. 16a and b, the pixels include blue 18 and red 14 light emitting elements which have a relatively low luminous efficiency but, along with a green 16 light emitting element, provide a large color gamut. Because the green light emitting element 16 has a peak wavelength that nearly matches the peak sensitivity of the human visual system it will provide a relatively high luminous efficiency and a highly saturated green at the same time. Additionally, the pixel includes two whites, one 12a which is biased toward red and another 12c that is biased toward blue. Each of these whites will have very good luminous efficiency and can be used to provide desaturated red and blue, thereby maximizing the efficiency of the pixel. Referring to FIG. 16b, the elements may be laid out in a stripe pattern.

Figure 17A:
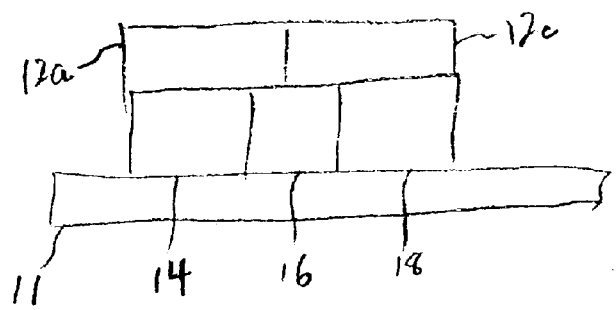
FIGS. 17a and b are schematic side and top views of a stacked OLED pixel according to an alternative embodiment of the present invention.
Figure 17B:
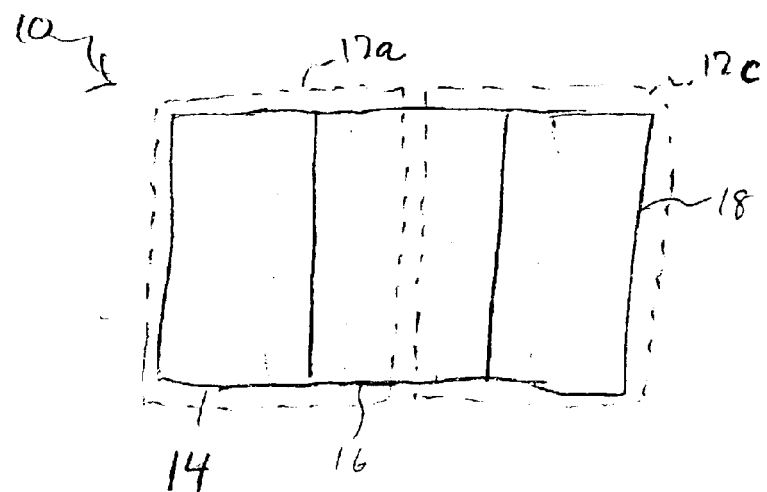

Alternatively, an embodiment employing five light emitting elements can be laid out as shown in FIGS. 17a and b, where the combined light emitting areas of the white light emitting elements 12a and 12c is equal to the combined light emitting areas of the red, green and blue light emitting elements 14, 16 and 18.

Because the efficiency of the various materials used in OLED devices vary, it is also possible to optimize the lifetime of a pixel by varying the relative sizes of the light emitting elements. If a less efficient element (which will age faster given the same brightness provided by all elements) is larger, the current density of that element will be relatively smaller, thereby prolonging the lifetime of the element. By judicious choices of the relative sizes of the light emitting elements, the lifetimes of all the elements can be made nearly equal.

Figure 9:
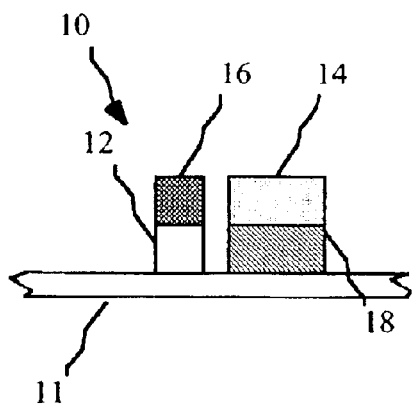
FIG. 9 is a schematic side view of a stacked OLED pixel according to an alternative embodiment of the present invention.

Referring to FIG. 9, utilizing white and green light emitting materials that are more efficient than the red and blue emitting materials, an improved lifetime pixel is provided by smaller white 12 and green 16 light emitting elements that are arranged in one stack and larger red 14 and blue 18 light emitting elements that are arranged in an adjacent stack. Because the white 12 and green 16 elements utilize materials that are more efficient than the red and blue materials, this arrangement will have improved, overall lifetime.

Figure 10:
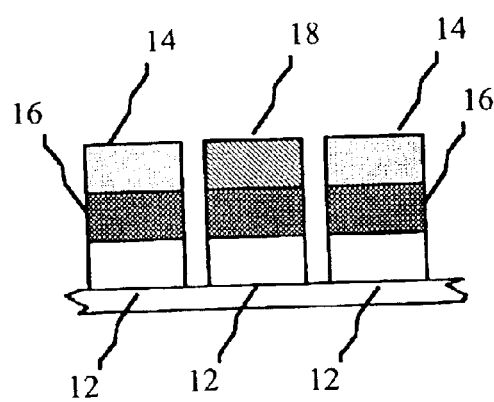
FIG. 10 is a schematic side view of a stacked OLED pixel according to an alternative embodiment of the present invention.

Referring to FIG. 10, multiple stacks with more than two layers may be employed in a pixel of the present invention.

As noted above, to optimize a display device for various applications, differently sized light emitting elements may be used. Saturated colors occur less frequently than unsaturated colors in both natural and computer generated images and graphics. Hence the efficiency of a display can be improved by using the white light emitting element in the place of the colored light emitting elements. Moreover, the use of the white light emitting element can be so high in typical applications that in order to reduce the current density in the white light emitting element, it is useful to increase the size of the white light emitting element.

Figure 11A:
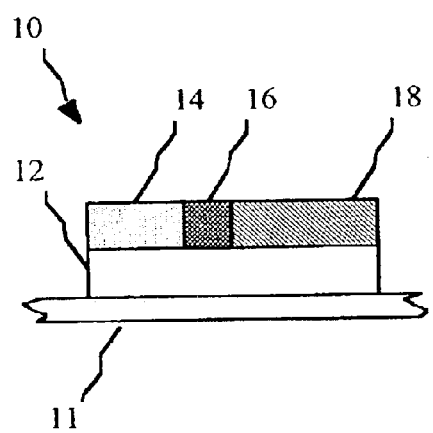
FIGS. 11a and b are schematic side and top views of a stacked OLED pixel according to an alternative embodiment of the present invention.
Figure 11B:
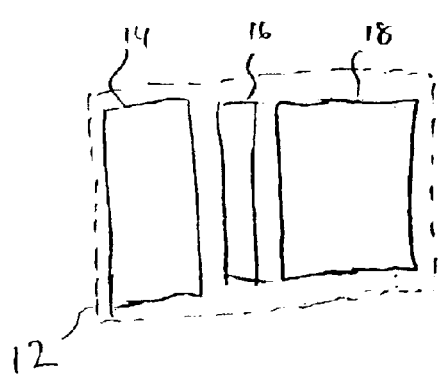
Figure 11C:
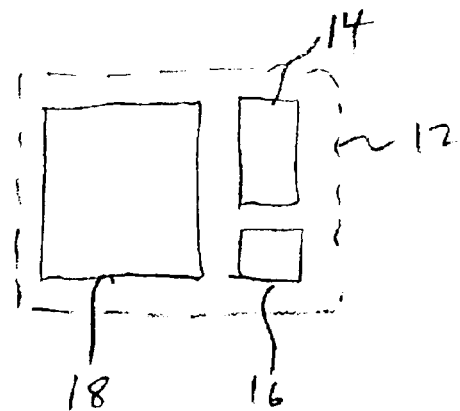

Typical OLED materials presently in use have a relatively higher efficiency for white and green light emitting elements and a relatively lower efficiency for the red and blue elements. Therefore, an optimized display according to the present invention may have relatively larger red and blue light emitting elements, and relatively smaller green elements. For example, in applications for which black and white use dominates, the additional white light emitting elements will be used more heavily than any of the gamut defining elements and may therefore be increased in size to reduce the current density and hence aging of the additional element. Text and graphic based applications are typically of this type. Referring to FIGS. 11a and b, a pixel 10 that embodies this principle may have colored light emitting elements wherein the green light emitting element 16 is the smallest and the white light emitting element is the largest. An alternative layout of the red, green and blue light emitting elements is shown in FIG. 11c.

Figure 12:
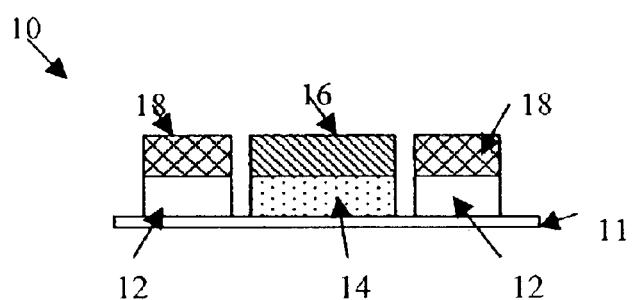
FIG. 12 is a schematic side view of a stacked OLED pixel according to an alternative embodiment of the present invention.

Applying the principle of differently sized color elements for the purpose of maximizing the lifetime of the display and more instances of independently addressable high luminance elements (i.e. white 12 and/or green 16) results in the pixel arrangement shown in FIG. 12. Such an arrangement is desirable when the pixel size is relatively small, for example, when the pixel subtends 2 minutes of visual angle or less on the human retina at the intended viewing distance. However, when the pixels are relatively large, i.e. subtending more than 2 minutes of visual angle at the intended viewing distance, the eye may see the luminance contrast between the light emitting elements and judge images displayed on this display device as having non-uniform regions where the area is addressed to provide a constant color across the entire spatial extent. Under these conditions, the use of differently sized high luminance element is inappropriate.

According to the present invention, luminance that would conventionally be produced by a combination of all of the lower power efficiency colored light emitting elements can instead be produced by the higher power efficiency white light emitting elements. Thus, any unsaturated color can be more efficiently reproduced by driving the white light emitting element(s) together with one or more of the other colored light emitting elements. A suitable transformation function may be provided by a signal processor that converts a standard color image signal to a power saving image signal that is employed to drive the display of the present invention.

Figure 13:
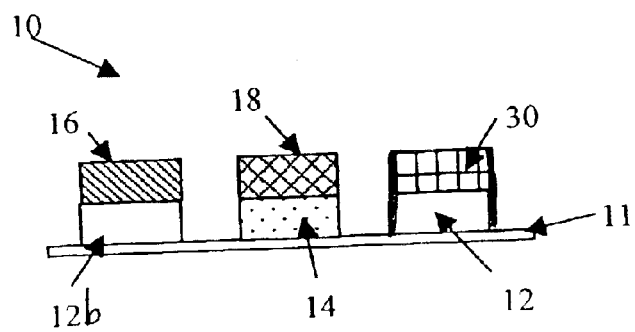
FIG. 13 is a schematic side view of a stacked OLED pixel according to an alternative embodiment of the present invention.

It should further be noted that the OLED materials may be doped to provide saturated colors other than red, green, and blue. A pixel structure employing such an embodiment is shown in FIG. 13. As shown, this pixel consists of two white 12 and 12b and a red 14 light emitting element in one layer with green 16, blue 18, and cyan 30 light emitting elements within a second layer. Such a structure provides a larger color gamut than can be provided with red, green, and blue light emitting elements alone but also provides the added energy efficiency provided by the white light emitting element. Alternatively, the two white elements 12 may have different white points, for example, a first white element 12 may emit light at the white point of the display and the second white element 12*b* may emit a white light that is biased toward green.

Figure 14:
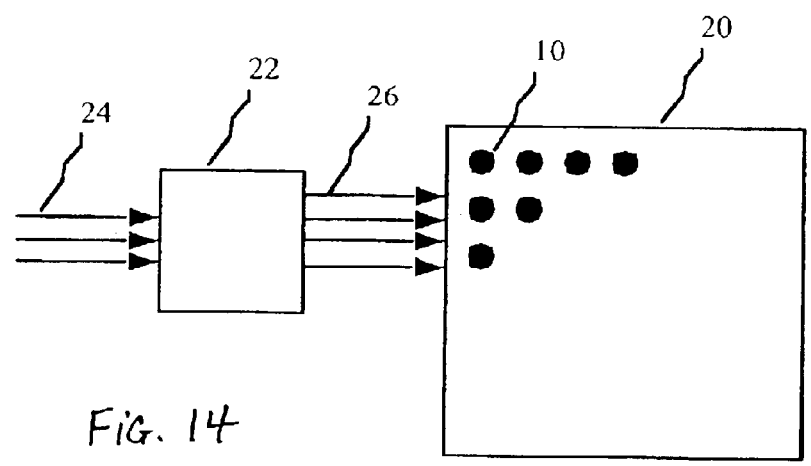
FIG. 14 is a schematic diagram of an OLED display device having stacked OLED pixels according to an alternative embodiment of the present invention.

Referring to FIG. 14, a color OLED display includes a display panel 20 having pixels 10 according to the present invention and a signal converter 22. The signal converter 22 converts a standard color image signal 24 to a power saving color image signal 26 suitable for driving the display panel 20, and can include a general purpose microprocessor or special purpose digital signal processing circuits as is known in the art.

The color of the additional white element 12 may be designed to match a desired white point of the display. In this case, a controller used to drive the display is configured to allow any gray value, including white, which would typically be presented using a combination of the red 14, green 16, and blue 18 light emitting elements to be created using primarily the white light emitting element 12. To achieve this, the peak luminance of the white light emitting element 12 is designed to match the combined luminance of the red 14, green 16, and blue 18 light emitting elements. That is, in a typical configuration where the prior art display would be designed to achieve a peak luminance of 100 cd/sq. m, the red 14, green 16, and blue 18 light emitting elements will be set up to produce this peak luminance when they are all turned on to their maximum value and the additional light emitting element 18 will also be designed to provide this same peak luminance.

It should be noted however, that under certain circumstances it may be desirable to design the color of the additional white light emitting element 12 to provide a color point other than the display white point inside the gamut defined by the red, green, and blue elements. For example by biasing the color of the white light emitting element 12 towards the color of one of the other colored light emitting elements, the designer can reduce the reliance of the display on the colored light emitting element(s) toward which the additional element is biased. This approach can be used to adjust the relative lifetimes and/or power efficiency of the light emitting elements of the pixel.

It may also be desirable to set the peak luminance of the additional white light emitting element 12 to other luminance values, including lower values, such as half the luminance of the peak luminance of the combined gamut elements which increases the reliance on the gamut elements while reducing the reliance on the additional element. The peak luminance of the additional element may also be designed to higher values, such as one and a half times the peak luminance of the combined gamut elements. However, this bias can result in loss of saturation for colors that are high in luminance that should be rendered as high in saturation.

Once the display is designed to provide a desired luminance value for each light emitting element, a suitable method is employed to map from a conventional three-channel data signal to a four-channel signal, for example using a look-up table or matrix transform as is known in the art. Alternatively, the conversion may be accomplished real time using an algorithm that specifies the conversion. The signal conversion is implemented in the signal converter 22.

It should be noted, that the signal conversion described above does not consider the spatial layout of the OLEDs within the display device. For example, for the pixel arrangement shown in FIG. 11*a*, the pixels may be arranged as shown in FIG. 11*b* or 11*c*, however, it is known that conventional RGB image signals represent the color of a pixel at all points within the pixel. Since all of the light emitting elements in a pixel according to the present invention are not necessarily located in the same spatial location within the pixel, visually apparent artifacts may be produced. The appearance of these artifacts may be reduced through the use of a spatial interpolation algorithm, such as the one discussed by Klompenhouwer et al. entitled "Sub-pixel Image Scaling for Color Matrix Displays".

A spatial interpolation algorithm will, depending upon the spatial content of the image, adjust the drive signal for each OLED to reduce the visibility of spatial artifacts and improve the image quality of the display, particularly near the edges of objects within the image and will be applied in conjunction with or after the before-mentioned signal conversion is applied. It should be noted that the image quality improvement that is obtained near the edges of objects within the image is derived from increased sharpness of edges, decreases in the visibility of color fringing and improved edge smoothness. The spatial interpolation algorithm may be implemented in the signal converter 22.

Because the transform from three to four colors is non-deterministic (i.e. a given color in the conventional specification may be created with different combinations of the colored light emitting elements and the white light emitting element), different conversions are possible. By selecting the peak luminance of the white light emitting element to match the combined peak luminances of the colored light emitting elements, it is possible to perform the conversion to allow the white light emitting element to provide as much luminance to each color as possible while maintaining saturation of all colors. This approach provides the maximum power savings possible with pixels according to the present invention.

This process is most efficient when the white point of the display matches the white point of a single white light emitting element. However, when one of the colored light emitting elements is less efficient than the other colored light emitting elements, the color of the white light emitting element may be selected to be biased toward the less efficient colored light emitting element. By selecting the chromaticity coordinate of the white OLED in this way, the element with the lowest power efficiency is replaced more often by the white OLED, decreasing the overall power usage. In this alternative implementation, the various OLED materials will age at different rates depending on the material characteristics and usage.

In an emissive system, colors that fall near the wavelengths of the CIE diagram that are near the peak of human visual system sensitivity, i.e. saturated yellow-greens, greens, and cyan-greens that plot near the wavelength of 570 nm, are likely to have higher luminous efficiency than white light emitting materials since white light emitting materials must emit a significant portion of their radiant energy at wavelengths that are not near this peak in human visual sensitivity. However, by this same logic, white light emitting materials will typically have higher energy efficiency than red and blue light emitting materials since the white light emitting materials must emit a significant portion of their energy near this peak in sensitivity and pure reds and blues emit light with energy that is not near the peak of human visual sensitivity.

Figure 15:
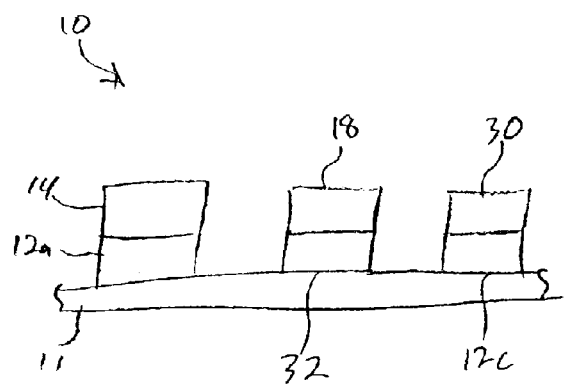
FIG. 15 is a schematic diagram of an OLED display device having stacked OLED pixels according to an alternative embodiment of the present invention.

For this reason, it is likely that more efficient devices with larger color gamut than shown in FIG. 13 may actually be possible using a pattern of light emitting elements as shown in FIG. 15. FIG. 15 provides a pixel structure employing red 14 and blue 18 light emitting elements with corresponding white light emitting elements biased toward red 12a and blue light 12c. However, instead of having a green light emitting element, this pixel arrangement provides a cyan 30 and yellow 32 light emitting elements. Since each of these colors can provide peaks in radiant output near the peak sensitivity of the human eye, they can be more efficient than a white light emitting material and yet they can also provide a larger color gamut than a pixel having red, green, blue, and white light emitting structure.

In the embodiments that have been discussed above, it is important to note that because the white light emitting element is significantly more efficient than at least one of the colored light emitting elements, the current density or power required to drive the white light emitting element is significantly lower than for at least one of the colored light emitting elements. It is also important to note that the luminance stability over time of the materials used to create the light emitting elements is typically related to the current density used to drive the elements through a very non-linear function in which the luminance stability over time of the material is much poorer when driven to higher current densities. In fact, the function used to describe this relationship can typically be described as a power function. For this reason, it is not desirable to drive any elements to current densities that are higher than a given threshold where the function describing the luminance stability over time is particularly steep. At the same time, it may be desirable to achieve maximum display luminance values that would typically require the colored light emitting elements to be driven to this current density.

The present invention can be employed in most OLED device configurations that include an efficient white light emitting element in each pixel. These include structures comprising a separate anode and cathode per OLED and more sophisticated devices, such as passive matrix displays having orthogonal arrays of anodes and cathodes to form pixels, and active matrix displays where each pixel is controlled independently, for example, with a thin film transistor (TFT).

The invention has been described in detail with particular reference to certain preferred embodiments thereof, but it will be understood that variations and modifications can be effected within the spirit and scope of the invention.

Parts List 10 pixel
11 substrate
12, a, b, c white light emitting element
14 red light emitting element
16 green light emitting element
18 blue light emitting element
20 display
22 converter
24 signal
26 adjusted signal
30 cyan light emitting element
32 yellow light emitting element

What is claimed is:

1. An OLED device, comprising:
   a) a pixel including a plurality of individually addressable light emitting elements including a light emitting element for emitting white light, and one or more light emitting elements for emitting colored light;
   b) at least one of the light emitting elements being stacked on top of another of the light emitting elements; and
   c) the white light emitting element being more efficient than at least one of the colored light emitting element(s).

2. The OLED device claimed in claim 1, including two or more colored light emitting elements and wherein two or more of the colored light emitting elements are stacked and the white light emitting element is located adjacent the stack of colored light emitting elements.

3. The OLED device claimed in claim 2, wherein the colored light emitting elements include red, green and blue light emitting elements.

4. The OLED device claimed in claim 1, wherein the light emitting elements are the same size and are arranged in a single stack.

5. The OLED device claimed in claim 4, wherein the colored light emitting elements include red, green and blue light emitting elements.

6. The OLED device claimed in claim 1, wherein two or more of the colored light emitting elements are arranged adjacent to each other and stacked with the white emitting element.

7. The OLED device claimed in claim 6, wherein the colored light emitting elements include red, green and blue light emitting elements arranged adjacent to each other.

8. The OLED device claimed in claim 1, wherein the light emitting elements are arranged in a plurality of stacks.

9. The OLED device claimed in claim 8, wherein the colored light emitting elements include red, green and blue light emitting elements and the green and white light emitting elements are arranged in one stack and the red and blue elements are arranged in another stack.

10. The OLED device claimed in claim 8, wherein stacks of light emitting elements have different light emitting areas.

11. The OLED device claimed in claim 10, wherein the colored light emitting elements include red, green and blue light emitting elements and the green and white light emitting elements are arranged in one stack and the red and blue elements are arranged in another stack, and wherein the light emitting area of the red and blue stack is larger than the light emitting area of the green and white stack.

12. The OLED device claimed in claim 10, wherein the colored light emitting elements include red, green, and blue light emitting elements and the green and red light emitting elements are arranged in one stack and the white and blue light emitting elements are arranged in another stack.

13. The OLED device claimed in claim 10, wherein the colored light emitting elements include red, green, and blue light emitting elements and the green and white light emitting elements are arranged in one stack and the red and blue light emitting elements are arranged in another stack.

14. The OLED device claimed in claim 1, wherein two or more of the individually addressable light emitting elements emit the same color of light or white light and are not located in the same stack.

15. The OLED device claimed in claim 14, wherein the pixel comprises stacks of white and red; white and blue; and white and green light emitting elements.

16. The OLED device claimed in claim 14, wherein the pixel comprises stacks of white and green; white and red; and green and blue light emitting elements.

17. The OLED device claimed in claim 14, wherein the pixel comprises stacks of white and green; white and blue; and green and red light emitting elements.

18. The OLED device claimed in claim 14, wherein the pixel comprises two stacks of white, green and red; and a stack of white, green and blue light emitting elements.

19. The OLED device claimed in claim 1, wherein the pixel comprises a plurality of stacks of light emitting elements, each stack including an element for emitting white light.

20. The OLED device claimed in claim 19, wherein the white light emitting elements are biased toward different colors.

21. The OLED device claimed in claim 20, wherein the stacks include a red light emitting element; a white light emitting element that is biased toward red; a green light emitting element; a white light emitting element that is biased toward green; a blue light emitting element; and a white light emitting element that is biased toward blue.

22. The OLED device claimed in claim 1, wherein the pixel comprises more than three colored light emitting elements.

23. The OLED device claimed in claim 22, wherein the colored light emitting elements produce red, green, blue, and cyan colored light respectively.

24. The OLED device in claim 22, wherein the colored light emitting elements produce red, blue, and two other colors of light near the peak human visual sensitivity.

25. The OLED device in claim 22, wherein the two other colors of light are yellow and cyan.

26. The OLED device claimed in claim 1, wherein the stacks include a stack having a red light emitting element and a white light emitting element that is biased toward red; a stack having a green light emitting element; a stack having a blue light emitting element and a white light emitting element that is biased toward blue.

27. An OLED device, comprising:
 a) a first layer of independently addressable light emitting elements;
 b) a second layer of independently addressable light emitting elements located on top of the first layer; and
 c) wherein the resolution of the first and second layers of independently addressable light emitting elements is different.

28. The OLED device claimed in claim 27, wherein light emitting elements within a layer have different light emitting areas.

29. The OLED device claimed in claim 27, wherein one of the layers includes white light emitting elements and the other layer includes colored light emitting elements.

30. The OLED device claimed in claim 29, wherein the white light emitting elements are more efficient than one or more of the colored light emitting elements.

31. The OLED device claimed in claim 29, wherein the colored light emitting elements include red, green, and blue light emitting elements.

32. An OLED device, comprising:
 a) a pixel including a plurality of individually addressable light emitting elements for emitting different colors of light, wherein at least one of the light emitting elements emits white light and at least one other of the light emitting elements emits a saturated color of light; and
 b) the light emitting elements of the pixel being arranged in two or more stacks.

33. The OLED device claimed in claim 32, wherein the white light emitting element is more efficient than one or more of the colored light emitting elements.

34. The OLED device claimed in claim 32 wherein the light emitting areas of the stacks are different in size.

35. The OLED device claimed in claim 32, wherein the number of light emitting elements in the stacks are different.

* * * * *